United States Patent
Trauth et al.

(10) Patent No.: US 8,115,544 B2
(45) Date of Patent: Feb. 14, 2012

(54) AMPLIFIER CIRCUIT AND INTEGRATED CIRCUIT THEREFOR

(75) Inventors: Gerhard Trauth, Muret (FR); Ludovic Oddoart, Frouzins (FR)

(73) Assignee: Freescale Semiconductor, Inc., Austin, TX (US)

( * ) Notice: Subject to any disclaimer, the term of this patent is extended or adjusted under 35 U.S.C. 154(b) by 597 days.

(21) Appl. No.: 12/300,439

(22) PCT Filed: May 16, 2006

(86) PCT No.: PCT/IB2006/052663
§ 371 (c)(1),
(2), (4) Date: Nov. 11, 2008

(87) PCT Pub. No.: WO2007/132297
PCT Pub. Date: Nov. 22, 2007

(65) Prior Publication Data
US 2011/0169575 A1 Jul. 14, 2011

(51) Int. Cl.
*H03F 3/45* (2006.01)
(52) U.S. Cl. .......... 330/69; 330/307

(58) Field of Classification Search .......... 330/11, 330/69, 307
See application file for complete search history.

(56) References Cited

U.S. PATENT DOCUMENTS

| | | | |
|---|---|---|---|
| 4,206,416 A * | 6/1980 | Kellogg | 330/69 |
| 4,583,052 A | 4/1986 | Ishii | |
| 5,694,081 A | 12/1997 | Fiori, Jr. | |
| 5,841,308 A | 11/1998 | Nagata | |
| 6,316,992 B1 | 11/2001 | Miao et al. | |
| 6,515,542 B1 * | 2/2003 | Wang et al. | 330/69 |
| 6,838,935 B2 * | 1/2005 | Suzuki | 330/69 |
| 2005/0134367 A1 | 6/2005 | Johnson et al. | |

* cited by examiner

*Primary Examiner* — Khanh Nguyen

(57) ABSTRACT

An amplifier circuit on a single die comprises a low voltage amplifier with a first common mode voltage and having an input and an output. A power amplifier has a second common mode voltage whose input is operably coupled to an output of the low voltage amplifier. The first common mode voltage and second common mode voltage are unequal. A compensation circuit is operably coupled to an input of the power amplifier and arranged to inject a DC-current or apply a common mode voltage into the power amplifier that is representative of a difference between the first common mode voltage and the second common mode voltage.

20 Claims, 4 Drawing Sheets

AMPLIFIER CIRCUIT AND INTEGRATED CIRCUIT THEREFOR

FIELD OF THE INVENTION

This invention relates to de-coupling in amplifier circuits. The invention is applicable to, but not limited to, decoupling of the direct current (DC) signal from an alternating current (AC) audio signal in audio amplifier circuits.

BACKGROUND OF THE INVENTION

There is a wide use of amplifiers in today's electronic circuits. One type of amplifier, known as a "pre-amplifier", is typically used to amplify ("preamplify") an unrefined, weak signal that is received from a source, such as a microphone transducer. The pre-amplifier amplifies the input analogue audio signal to provide a larger-amplitude "preamplified" output signal that has the same waveform as the input signal, within a particular tolerance. Similarly, with a received audio signal, a low level audio signal may then be applied to a pre-amplifier and the preamplified signal then passed on to a further audio power amplification stage, to drive an output device, such as a loudspeaker.

Noise may accompany the input signal if the input lines that deliver the input signal pick up noise from a source external to the integrated circuit (IC). Such noise may emanate from, for example, a noisy direct current (DC) power supply that powers a transducer, such as a microphone. Hence, most electronic circuits amplifying alternating current signals, such as audio signals, require de-coupling of the DC effects from the AC signal.

Referring now to FIG. 1, a known single-ended audio circuit decoupling a DC signal from an AC audio signal is illustrated. In this respect, FIG. 1 discloses a classic topology where there exists two differing common mode voltages in the audio signal path. Notably, the classic circuit topology requires pads and external components.

Audio Power Amplifiers are especially used to drive low impedance loads. The difference in the preamplifier and Power amplifier are especially in the current capability. The pre amplifier is able to drive a couple of 100's of uA, while the Power Amp. is able to drive a couple of 100's of mA.

An input signal 105 is input via an input resistance 110 to a first amplification stage 115 that is operating in common mode using a Vreg/2 input 120. A feedback resistor 125 completes the first stage.

The first amplification stage 115 is operably coupled to a second common mode amplification stage 155, 165, which operates in common mode using a Vbatt/2 input 160. Two integrated circuit pins 130, 135 and an external (large) capacitor 140 are required in order to avoid creating an undesired DC offset in connecting the two stages. Undesired DC offsets are created due to the output of the first stage being Vreg/2 and the second stage regulating its input of the Amp to Vbatt/2. Thus, without the use of the two integrated circuit pins 130, 135 and an external (large) capacitor 140 an undesired current of (Vbatt/2−Vreg/2)/R would be passed through the input resistor R 145 of the second amplification stage 155. This current flows also through the feedback resistor (2R) 150 of the second stage and results into a common mode voltage at the output of the second amplification stage 155. Notably, this voltage is Vbatt/2+I*2R and not at a desired mid-range value.

Due to the fact the output is not at a mid-range value, having a DC signal passed through the amplifier chain would result in clipping of the input signal as soon as it becomes higher than:

$$Vbatt-(Vbatt/2-Vreg/2)*2R/R. \quad [1]$$

Amplifier 165 is an inverting amplifier and uses the resistors 175 and 170 to buffer the signal at the output of the amplifier 155. Thus, the loudspeaker 180 then sees the same signal as the output of amplifier 155, but in an opposite phase.

Referring now to FIG. 2, a known differential circuit decoupling a DC signal from an AC audio signal is illustrated. In this respect, FIG. 2 illustrates a classic high performance topology. Notably, the two stages have different common mode voltages. Furthermore, the classic differential circuit topology requires four pads and two external capacitors.

An input signal 205 is input to a low voltage first differential common mode amplification stage 215, 225 via an input resistor (R) 210. The low voltage differential common mode amplification stage 215, 225 operates in common mode using a Vreg/2 input 235 applied through resistor 240. Feedback resistors (2R) 220, 245 set the gain of the first stage, with the common mode inputs being provided via the feedback resistors (R) 230.

The first amplification stage 215, 225 is operably coupled to a second differential common mode audio power amplification stage 282, 284, which operates in common mode using a Vbatt/2 input 294. Four integrated circuit pins 250, 260, 265, 275 and two external (large) capacitors 255, 270 are used in order to avoid creating an undesired DC offset in connecting the two stages. Undesired DC offsets are created due to the output of the first low voltage amplification stage being Vreg/2 and the second audio power amplification stage regulating its input of the amplifier to Vbatt/2. Thus, without the use of the four integrated circuit pins 250, 260, 265, 275 and two external (large) capacitors 255, 270 an undesired current of (Vbatt/2−Vreg/2)/R would be passed through the input resistors (R) 278, 290 of the differential common mode audio power amplification stage 282, 284. The current also flows through the feedback resistors (2R) 280, 292 of the differential common mode audio power amplification stage 282, 284. Notably, the common mode voltage at the output of the differential common mode audio power amplification stage 282, 284, is Vbatt/2+I*2R, and not at a desired mid-range value.

Thus, in the audio circuits of FIG. 1 and FIG. 2, component count is increased due to the need to use one or more external capacitor(s). Furthermore, PIN count on the integrated circuit (IC) is increased due to the need to connect the external capacitor(s).

Finally, as the impedance range of the transducer is low, and as the decoupling capacitances must behave like a short circuit for a low frequency audio signal (20 Hz), the value of the decoupling capacitor must be very large (for example of the order of 100 nF). This makes the implementation both very expensive and requires an increased are on the printed circuit board (PCB).

Furthermore, the product manufacturers who utilize such audio amplifiers, such as mobile phone manufacturers, are requiring improvements in reducing noise. This is particularly the case for provision of future technologies and features where audio sensitivity to noise has been identified as a key user requirement. One solution to the aforementioned problems could be to introduce a voltage-to-current (V-I) converter with the low-voltage amplifier and a current-to-voltage (I-V) converter with the power amplifier. However, such a solution fails to meet stringent noise specifications.

Thus, there exists a need to improve the decoupling performance in audio amplifier systems, whilst not impacting noise specifications.

SUMMARY OF THE INVENTION

In accordance with the preferred embodiment of the present invention, there is provided an amplifier circuit and an integrated circuit therefor, as claimed in the accompanying Claims.

Figure 1:
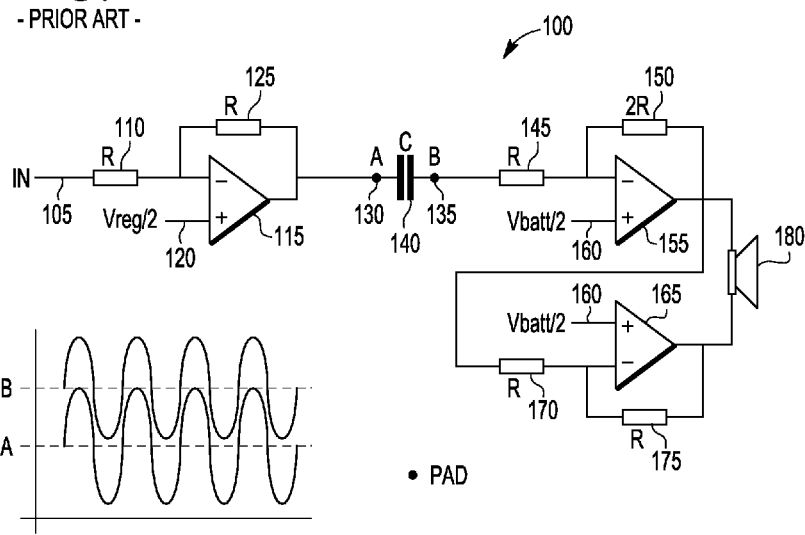
FIG. 1 illustrates a known single-ended circuit that decouples a DC signal from an AC audio signal.
Figure 2:
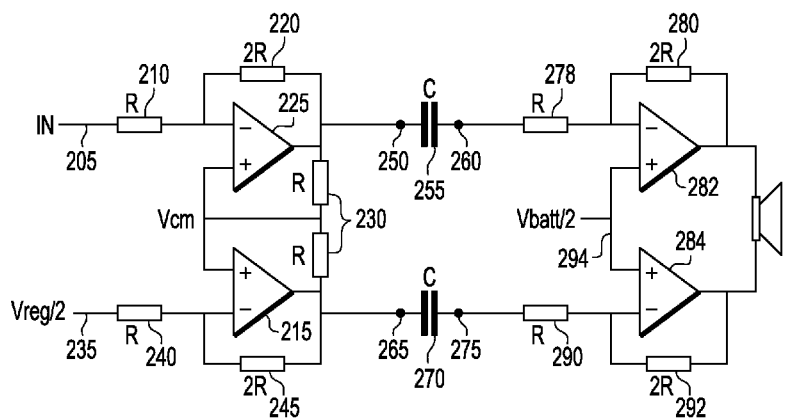
FIG. 2 illustrates a known differential circuit that decouples a DC signal from an AC audio signal.
Figure 3:
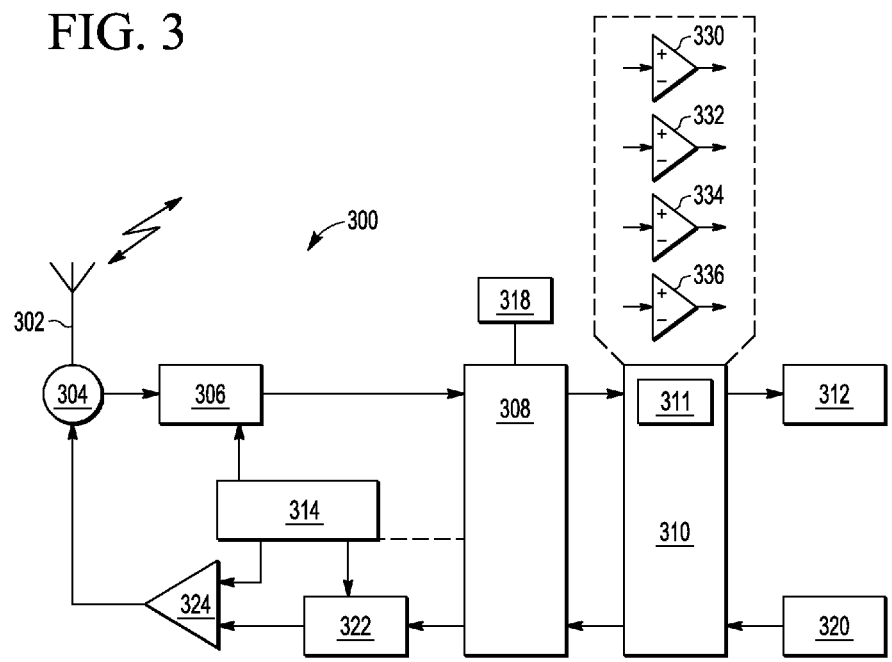
Figure 4:
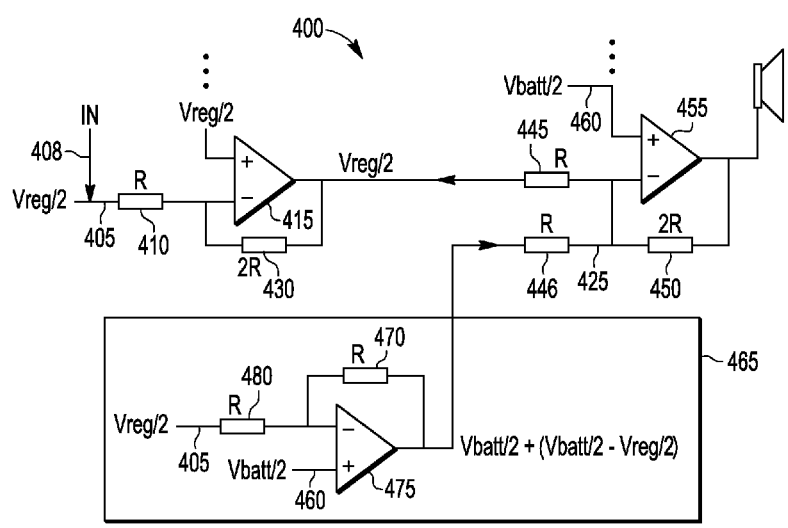
Figure 5:
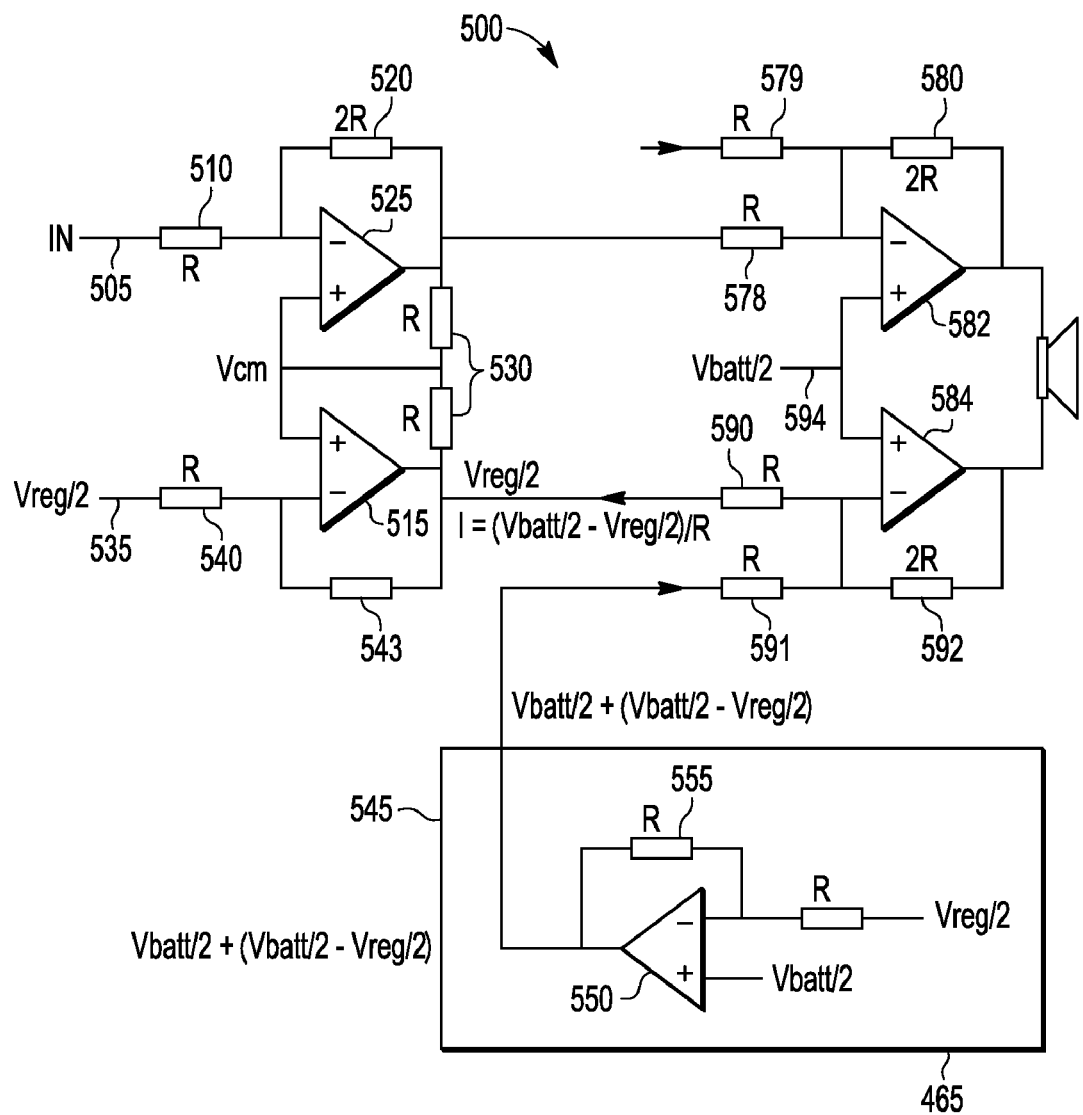
Figure 6:
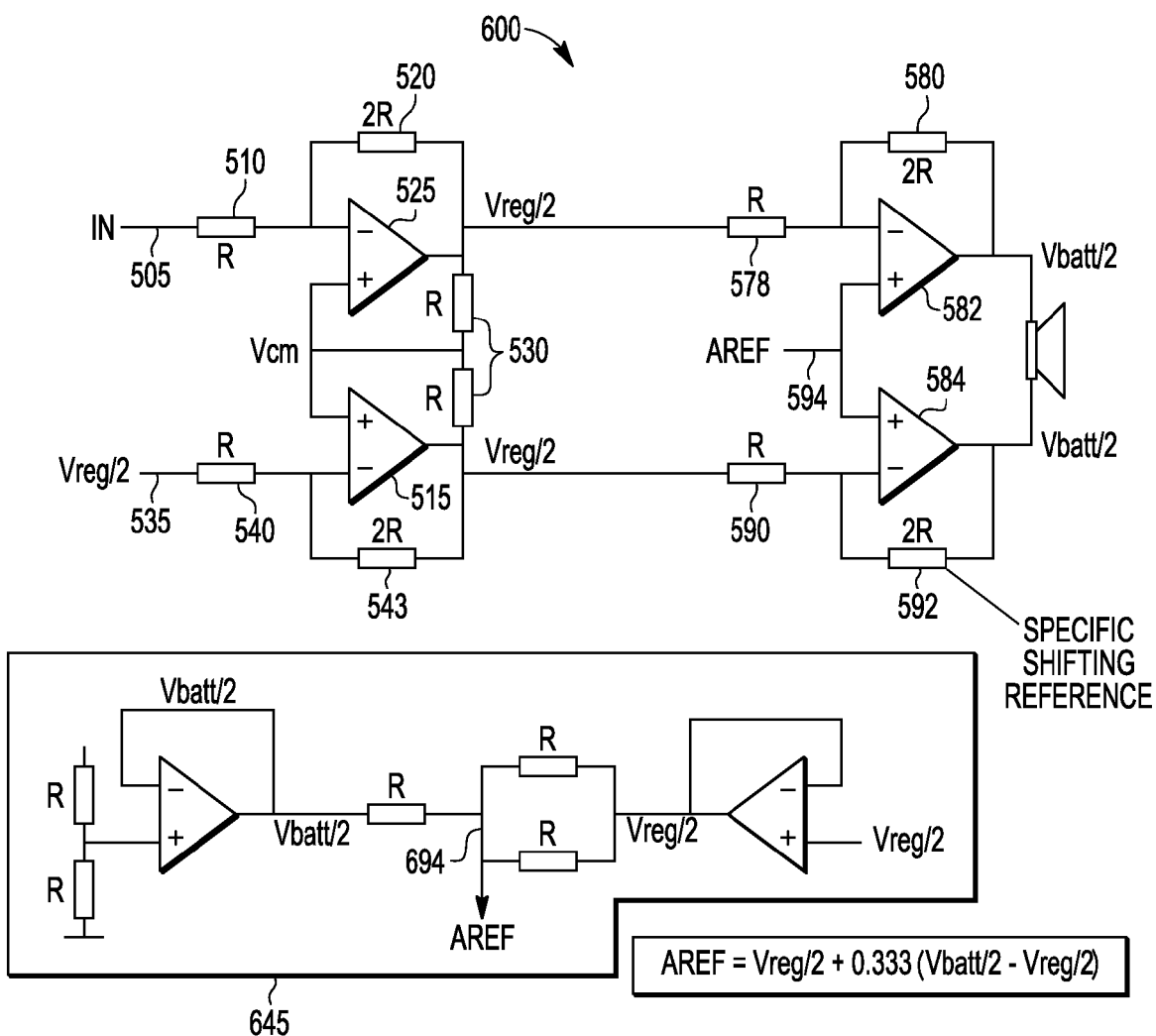

Embodiments of the present invention will now be described, by way of example only, with reference to the accompanying drawings, in which:

FIG. 3 illustrates a wireless communication unit comprising an audio circuit according to embodiments of the present invention;

FIG. 4 illustrates a single-ended circuit that decouples a DC signal from an AC audio signal in accordance with one embodiment of the present invention;

FIG. 5 illustrates a first differential circuit that decouples a DC signal from an AC audio signal in accordance with one embodiment of the present invention; and FIG. 6 illustrates a second differential circuit that decouples a DC signal from an AC audio signal in accordance with one embodiment of the present invention.

DESCRIPTION OF EMBODIMENTS OF THE INVENTION

In one embodiment of the present invention, an amplifier circuit on a single die comprises a low voltage amplifier with a first common mode voltage and having an input and an output. A power amplifier with a second common mode voltage has an input that is operably coupled to an output of the low voltage amplifier. The first common mode voltage and second common mode voltage are unequal. A compensation circuit is operably coupled to an input of the power amplifier and arranged to inject a DC-current or apply a common mode voltage into the power amplifier that is representative of a difference between the first common mode voltage and the second common mode voltage.

The injection of a DC current into the power amplifier that is representative of a difference between the first common mode voltage and the second common mode voltage, or the taking into account the DC current that is generated due to different common mode voltages and adjusting the common mode input of the second stage amplifier in response thereto, avoids the need for any de-coupling capacitor external to the IC. In this manner, a correct common mode voltage can be provided at the output of the amplifier circuit. Furthermore, a reduction in pin count on the IC may be achieved. In addition, a saving may be made on printed circuit board routing/space and therefore die size may be saved. Such an arrangement may provide the abovementioned advantages whilst not degrading the noise performance beyond noise specification limits.

In one embodiment of the present invention, the low voltage common mode amplifier may be a low voltage common mode audio amplifier and the power amplifier may be a common mode audio power amplifier arranged to amplify an audio input signal.

In one embodiment of the present invention, the compensation circuit may be operably coupled to an input of the power amplifier via an input resistance such that the current injected into the power amplifier is equal to a difference between a first common mode current and a second common mode current.

In one embodiment of the present invention, the low voltage amplifier and the power amplifier may be arranged in a single-ended configuration. In this embodiment, the compensation circuit may inject a current equal to the second common mode voltage minus the first common mode voltage divided by an input resistance value.

In one embodiment of the present invention, the low voltage amplifier and the power amplifier may be arranged in a differential configuration. In this embodiment the compensation current may be arranged to modify the output voltage of the low voltage amplifier in such a way that the DC output value that is input to the audio power amplifier is equal to the second common mode voltage. The compensation current may equal the second common mode voltage plus a difference between the second common mode voltage and the first common mode voltage.

In one embodiment of the present invention, in a differential configuration the compensation current may be injected into a common mode input of the power amplifier. In this embodiment, the second common mode voltage may be arranged to equal the first common mode voltage plus a factor multiplied by the difference between the second common mode voltage and the first common mode voltage.

In one embodiment of the present invention, an integrated circuit comprises an amplifier circuit on a single die having a low voltage amplifier with a first common mode voltage and having an input and an output. A power amplifier, having a second common mode voltage, comprises an input that is operably coupled to an output of the low voltage amplifier. The first common mode voltage and second common mode voltage are unequal. A compensation circuit is operably coupled to an input of the power amplifier and arranged to inject a DC-current, or apply a common mode voltage, into the power amplifier that is representative of a difference between the first common mode voltage and the second common mode voltage.

Referring now to FIG. 3, a block diagram of a wireless audio communication unit 300, adapted to support the inventive concept of embodiments of the present invention, is illustrated. The wireless audio communication unit 300 comprises an antenna 302 preferably coupled to a duplex filter or antenna switch 304 that provides isolation between receive and transmit chains within subscriber unit 300. For completeness, the whole architecture of the wireless audio communication unit 300 will be described, albeit that the inventive concept relates to the audio amplification circuitry. The wireless audio communication unit 300 comprises a receiver chain that includes receiver front-end circuit 306 (effectively providing reception, filtering and intermediate or base-band frequency conversion). The receiver front-end circuit 306 is serially coupled to a signal processing function (generally realised by a digital signal processor (DSP)) 308. The processing function 308 performs de-interleaving, signal demodulation, error correction, data formatting, etc. of the received signal. Recovered analogue audio information from the signal processing function 308 is serially coupled to base-band processor 310, which comprises an audio amplifier circuit 311. The audio amplifier circuit 311 amplifies the audio signal, as described with reference to FIGS. 4 to 6, and sends it to a suitable audio output device 312, such as an audio speaker.

In one embodiment of the present invention, the audio amplifier circuit 311 comprises a number of parallel audio amplification stages. For example, the wireless communication unit may comprise a number of audio speakers 312, each with a dedicated amplifier. For example, a first amplifier 330 may be battery powered operating at, say, 0.5 W to 1 W, and dedicated as an alert amplifier (ALSP) that drives an audio speaker 312 during a phone call. A second amplifier 332 may be dedicated as an amplifier speaker, supplied by a voltage regulator on the baseband IC and provide, say, a 100 mW output to an ear-piece (not shown). A third amplifier 334 and a fourth amplifier 336 may be dedicated as headset amplifiers (AHSR and AHSL), supplied by the voltage regulator on the baseband IC and provide, say, a 15 mW output to the right and left headset audio speakers (not shown). For the alert amplifier that is not supplied by the regulator but supplied by the communication unit's battery, a symmetrical swing is required, thereby needing the respective amplifier chain to operate in common mode.

A controller 314 controls the information flow and operational state of each circuit/element/function. A timer 318 is preferably operably coupled to the signal processing function to provide synchronisation in both the signal recovery and signal generation processes.

As regards the transmit chain, this essentially includes an input device 320, such as a microphone or keypad, coupled in series through baseband processor 310 (comprising an audio amplifier circuit 311), signal processing function 308, transmitter/modulation circuitry 322 and a power amplifier 324. The signal processing function 308, transmitter/modulation circuitry 322 and the power amplifier 324 are operationally responsive to the controller 314, with an output from the power amplifier 324 coupled to the duplex filter or antenna switch 304, as known in the art.

Referring now to FIG. 4, a single-ended circuit that decouples a DC signal from an AC audio signal in accordance with one embodiment of the present invention is illustrated. A reference signal (Vreg/2) 405, together with the audio input signal 408 are fed to a first amplification stage 415 that is operating in common mode equal to Vreg/2. A feedback resistor 430 completes the first stage.

The first amplification stage 415 is operably coupled to a second common mode amplification stage 455, which operates in common mode using a Vbatt/2 input 460. In order to avoid creating an undesired DC offset (as the output of the first stage is Vreg/2 and the second stage regulates its input to the second stage amplifier 455 to Vbatt/2), a compensation circuit 465 is arranged to apply a compensation current to the common mode input of the second stage amplifier 455.

In one embodiment of the present invention, the compensation circuit 465 comprises an amplifier 475 with a Vbatt/2 reference input 460 and a Vreg/2 input 405 applied through input resistance 480. The feedback resistance 470 ensures that the output voltage is $$V = Vbatt/2 + (Vbatt/2 - Vreg/2) \quad [2]$$

In this manner, the compensation circuit 465 produces a compensation voltage applied on resistor 446 giving a current 425 of:

$$I = (Vbatt/2 - Vreg/2)/R \quad [3]$$

that is injected to the second stage power amplifier 455 via a further input resistor (R) 446, such that the current applied to resistor 446 is the same as the current through resistor 445. Hence, no current flows through resistor 450, and consequently there is no voltage drop across 450. Therefore, the common mode at the output of the second stage power amplifier 455 is Vbatt/2.

FIG. 5 illustrates a first differential circuit that decouples a DC signal from an AC audio signal, when coupling together two amplifier stages with different common modes, in accordance with one embodiment of the present invention. An input signal 505 is input to a low voltage first differential common mode amplification stage 515, 525 via an input resistor (R) 510. The low voltage differential common mode amplification stage 515, 525 is operating in common mode using a Vreg/2 input 535 through a respective input resistor 540. Feedback resistors (2R) 520, 543 set the gain of the first stage, with common mode feedback resistors (R) 530 setting the common mode voltage.

The first amplification stage 515, 525 is operably coupled to a differential common mode audio power amplification stage 582, 584, which operates in common mode using a common mode voltage 594 of Vbatt/2. A compensation circuit 545 is used to inject a compensation current into the differential common mode audio power amplification stage 582, 584 via resistor (R) 591.

In this manner, by appropriate setting of the compensation current, the compensation current avoids creating an undesired DC offset. In this manner, the current no longer flows through the feedback resistors (2R) 580, 592 of the differential common mode audio power amplification stage 582, 584. Consequently, the current no longer creates a voltage drop and the output of the differential common mode audio power amplification stage 582, 584 stays at its common mode voltage of Vbatt/2.

In one embodiment of the present invention, the compensation current may be predicted as follows: the current I due to the different common modes is (Vbatt/2−Vreg/2)/R. A voltage may then be generated with the same delta, above Vbatt/2, and injected via a resistor (R) 591. Hence, the compensation current will be equal to 'I'.

Referring now to FIG. 6, a second differential circuit 600 that decouples a DC signal from an AC audio signal, when coupling together two amplifier stages with different common modes, is illustrated in accordance with one embodiment of the present invention. The two amplifier stages are effectively the same as the circuit 500 in FIG. 5, with the compensation circuit applied in a different manner. Hence, the function and coupling of the two amplifier stages will not be replicated here.

The structure of the fully differential circuit 600 comprises a fully differential amplifier formed by amplifiers 525, 515 and the associated resistor network formed by resistors 510 and 520, 540 and 543. The amplifiers 525 515 provide the two output signals with a common mode equal to Vreg/2. The AREF node 594 of the second amplifier stage is the common mode voltage of amplifiers 582, 584.

In FIG. 6, the compensation circuit 645 is arranged to provide a common mode voltage (AREF) that is applied direct to the common mode input of the second differential common mode audio power amplifier stage. The voltage may be of the form:

$$AREF = Vreg/2 + 0.333(Vbatt/2 - Vreg/2) \quad [4]$$

In contrast to FIG. 5, the circuit of FIG. 6 illustrates an embodiment that applies Vbatt/2 as the common mode voltage on the second amplifier stage. Thus, no current is fed through the feedback resistor, which would result in a common mode voltage at the output of second amplifier stage of Vbatt/2.

The circuit of FIG. 6 provides a current through the feedback resistor 580, 592 and applies a common mode voltage (AREF) into the second stage amplifier that takes into account the voltage drop across the feedback resistor. The aim here is to ensure that a Vbatt/2 common mode voltage is provided at the output of the second stage amplifier, while the common mode of the first stage output is Vreg/2. Thus, the circuit 600 of FIG. 6 illustrates one embodiment of a circuit that generates a common mode voltage (AREF) that is equal to Vreg/2+the voltage (IR) drop of 578, considering the output voltage of the second stage amplifier (Vbatt/2), thereby resulting in the desired behaviour.

The circuit of FIG. 6 provides a current through the feedback resistor 580, 592 and applies a common mode voltage (AREF) into the second stage amplifier that takes into account the voltage drop across the feedback resistor. The aim here is to ensure that a Vbatt/2 common mode voltage is provided at the output of the second stage amplifier, while the common mode of the first stage output is Vreg/2. Thus, the circuit 600 of FIG. 6 illustrates one embodiment of a circuit that generates a common mode voltage (AREF) that is equal to VREG/2+the voltage (IR) drop of 578, considering the output voltage of the second stage amplifier (Vbatt/2), thereby resulting in the desired behaviour.

Of course, the various components within the audio amplifier circuits may be embodied in any suitable or application that is able to utilise the inventive concept of the present invention. For example, it is envisaged that the aforementioned inventive concept may be employed in any multimedia audio application, any entertainment or gaming device, a portable or mobile phone or radio, a digital voice recorder, an MP3 player, etc . . . .

Furthermore, it is envisaged that the inventive concept herein described is not limited to audio amplifiers and may be utilised in any amplifier circuit that employs two or more differing common mode voltages.

The audio amplifier circuit and integrated circuit therefor, as described above, aims to provide at least one or more of the following advantages:

(i) Avoids the use of any de-coupling capacitor external to the IC;
(ii) Reduces pin count on the IC; and
(iii) Saves PCB routing/space and therefore saves on die size
(iv) Improved low frequency (LF) effects as the LF signals are no longer filtered through a decoupling capacitor.

In particular, it is envisaged that the aforementioned inventive concept can be applied by a semiconductor manufacturer to any audio amplifier circuit. It is further envisaged that, for example, a semiconductor manufacturer may employ the inventive concept in a design of a stand-alone audio amplifier device, or application-specific integrated circuit (ASIC) and/or any other sub-system element.

It will be appreciated that any suitable distribution of functionality between different functional units may be used without detracting from the inventive concept herein described. Hence, references to specific functional devices or elements are only to be seen as references to suitable means for providing the described functionality, rather than indicative of a strict logical or physical structure or organization. Furthermore, the various components within the amplifier circuits can be realised in discrete or integrated component form, with an ultimate structure therefore being merely an application-specific selection.

Aspects of the invention may be implemented in any suitable form including hardware, software, firmware or any combination of these. The elements and components of an embodiment of the invention may be physically, functionally and logically implemented in any suitable way. Indeed, the functionality may be implemented in a single unit or IC, in a plurality of units or ICs or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to "a", "an", "first", "second" etc. do not preclude a plurality.

Thus, a number of amplifier circuits and integrated circuits therefor have been described wherein the abovementioned disadvantages associated with prior art circuits have been substantially alleviated.

The invention claimed is:

1. An amplifier circuit on a single die comprising:
a low voltage amplifier with a first common mode voltage and having an input and an output;
a power amplifier with a second common mode voltage whose input is operably coupled to the output of the low voltage amplifier wherein the first common mode voltage and the second common mode voltage are unequal; and
a compensation circuit operably coupled to the input of the power amplifier and arranged to inject a DC-current or apply a common mode voltage into the power amplifier that is representative of a difference between the first common mode voltage and the second common mode voltage.

2. The amplifier circuit according to claim 1 wherein the low voltage amplifier is a low voltage common mode audio amplifier and the power amplifier is a common mode audio power amplifier arranged to amplify an audio input signal.

3. The amplifier circuit according to claim 1 wherein the compensation circuit is operably coupled to the input of the power amplifier via an input resistance such that the DC-current injected into the power amplifier is equal to a difference between a first common mode current and a second common mode current.

4. The amplifier circuit according to claim 1 wherein the compensation circuit measures DC currents generated by the respective common modes and adjusts the common mode voltage into the power amplifier in response thereto.

5. The amplifier circuit according to claim 3 wherein the low voltage amplifier and the power amplifier are arranged in a single-ended configuration.

6. The amplifier circuit according to claim 5 wherein the compensation circuit injects a current equal to the second common mode voltage minus the first common mode voltage divided by an input resistance value.

7. The amplifier circuit according to claim 1 wherein the low voltage amplifier and the power amplifier are arranged in a differential configuration.

8. The amplifier circuit according to claim 7 wherein a compensation voltage equals the second common mode voltage plus a difference between the second common mode voltage and the first common mode voltage.

9. The amplifier circuit according to claim 8 wherein the common mode voltage equals the first common mode voltage plus a factor multiplied by the difference between the second common mode voltage and the first common mode voltage.

10. The amplifier circuit according to claim 2 wherein the compensation circuit is operably coupled to the input of the power amplifier via an input resistance such that the DC-current injected into the power amplifier is equal to a difference between a first common mode current and a second common mode current.

11. The amplifier circuit according to claim 2 wherein the compensation circuit measures DC currents generated by the respective common modes and adjusts the common mode voltage into the power amplifier in response thereto.

12. An integrated circuit comprising:
   an amplifier circuit on a single die having a low voltage amplifier with a first common mode voltage and having an input and an output;
   a power amplifier with a second common mode voltage whose input is operably coupled to the output of the low voltage amplifier wherein the first common mode voltage and the second common mode voltage are unequal; and
   a compensation circuit operably coupled to the input of the power amplifier and arranged to inject a DC-current or apply a common mode voltage into the power amplifier that is representative of a difference between the first common mode voltage and the second common mode voltage.

13. The integrated circuit according to claim 12 wherein the low voltage amplifier is a low voltage common mode audio amplifier and the power amplifier is a common mode audio power amplifier arranged to amplify an audio input signal.

14. The integrated circuit according to claim 12 wherein the compensation circuit is operably coupled to the input of the power amplifier via an input resistance such that the DC-current injected into the power amplifier is equal to a difference between a first common mode current and a second common mode current.

15. The integrated circuit according to claim 12 wherein the compensation circuit measures DC currents generated by the respective common modes and adjusts the common mode voltage into the power amplifier in response thereto.

16. The integrated circuit according to claim 14 wherein the low voltage amplifier and the power amplifier are arranged in a single-ended configuration.

17. The integrated circuit according to claim 16 wherein the compensation circuit injects a current equal to the second common mode voltage minus the first common mode voltage divided by an input resistance value.

18. The integrated circuit according to claim 12 wherein the low voltage amplifier and the power amplifier are arranged in a differential configuration.

19. The integrated circuit according to claim 18 wherein a compensation voltage equals the second common mode voltage plus a difference between the second common mode voltage and the first common mode voltage.

20. The integrated circuit according to claim 19 wherein the common mode voltage equals the first common mode voltage plus a factor multiplied by the difference between the second common mode voltage and the first common mode voltage.

* * * * *